(12) United States Patent
Ishii

(10) Patent No.: US 6,172,545 B1
(45) Date of Patent: Jan. 9, 2001

(54) DELAY CIRCUIT ON A SEMICONDUCTOR DEVICE

(75) Inventor: Toshio Ishii, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/073,223

(22) Filed: May 5, 1998

(30) Foreign Application Priority Data

May 9, 1997 (JP) .................................................. 9-135964

(51) Int. Cl.[7] .................................................. H03H 11/26
(52) U.S. Cl. ........................ 327/276; 327/264; 327/284
(58) Field of Search .................................. 327/264, 272, 327/276, 278, 281, 270, 271, 277, 286, 285, 288, 393, 394, 399, 400, 284, 437

(56) References Cited

U.S. PATENT DOCUMENTS 4,947,064 * 8/1990 Kim et al. ............................ 307/594
5,121,014 * 6/1992 Huang ................................. 307/605
5,227,679 * 7/1993 Woo .................................... 307/469

FOREIGN PATENT DOCUMENTS 61-98011  5/1986 (JP) .

* cited by examiner

*Primary Examiner*—Terry D. Cunningham
*Assistant Examiner*—Quan Tra
(74) *Attorney, Agent, or Firm*—Ostrolenk, Faber, Gerb & Soffen, LLP

(57) ABSTRACT

A delay circuit based on gate delay enables precise adjustment of a delay value. The delay circuit is composed of a plurality of p-channel transistors and n-channel transistors connected in series which are provided with capabilities that differ, ranging from the transistors closer to a power supply to the transistors closer to an output end so as to change the output drive capability and the input capacity independently, thereby improving the adjustment accuracy of the delay value of the circuit.

6 Claims, 6 Drawing Sheets

$W_{P1} < W_{P2}$ $W_{N1} < W_{N2}$

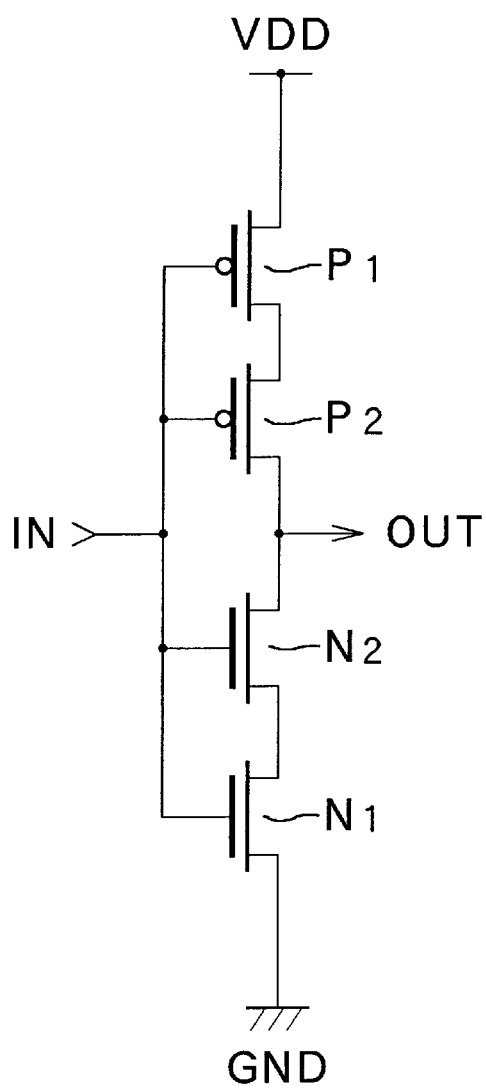
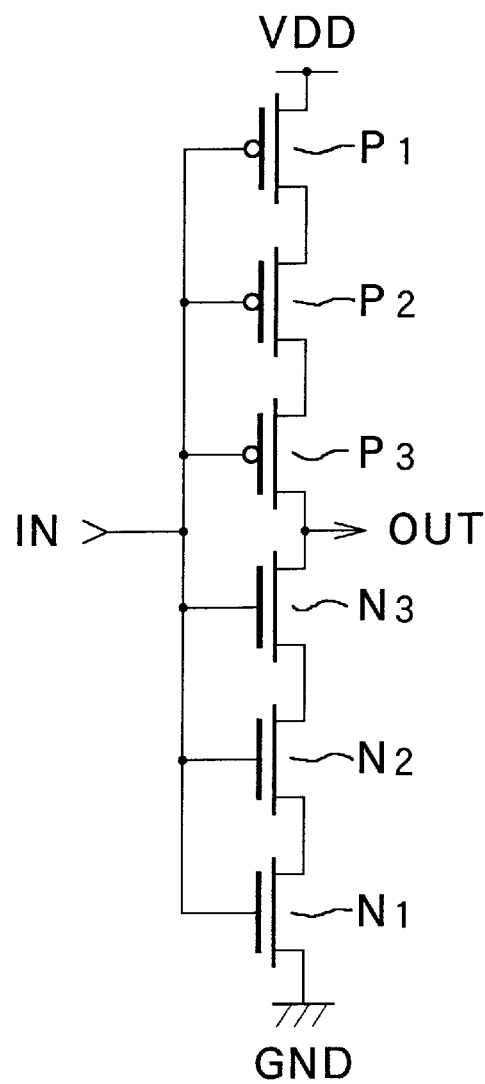
FIG. 1A PRIOR ART
FIG. 1B PRIOR ART $W_{P1} < W_{P2}$ $W_{N1} < W_{N2}$

DELAY CIRCUIT ON A SEMICONDUCTOR DEVICE

BACKGROUND OF THE INVENTION

1. Field of the Invention

The present invention relates to a semiconductor device and, more particularly to a delay circuit formed thereon.

2. Description of the Prior Art

Semiconductor devices often use circuit delay function which may be provided by gate circuits such as inverters to generate various timings on a circuit. In most circuits for obtaining large delay values, gate circuits such as inverters are connected in series in a plurality of stages (cascade connection) so as to obtain the delay value resulting from the sum of the delay values of all the stages of the gate circuits.

In such a case, the number of the circuit stages to be connected in series can be decreased by providing a larger delay value per stage of the gate circuit. An example of the prior art for providing a larger gate delay value per stage has been disclosed, for instance, in Japanese Unexamined Patent Publication No. 61-98011. In this patent publication, a delay circuit has been proposed in which a plurality of p-channel MOS transistors and n-channel MOS transistors are connected in series in a CMOS gate array LSI. The configurations of the conventional delay circuits are shown in FIGS. 1A and 1B.

FIG. 1A shows a circuit configuration in which two stages are connected in series between the power supply and the ground; more specifically, p-channel MOS transistors P1 and P2 and n-channel MOS transistors N1 and N2 are connected in series. The source of the p-channel MOS transistor P1 is connected to a power supply VDD, while the drain thereof is connected to the source of the p-channel MOS transistor P2, the drain of which is connected to the drain of the n-channel MOS transistor N2. The source of the n-channel MOS transistor N2 is connected to the drain of the n-channel MOS transistor N1, the source of which is connected to ground GND. The gate terminals of the transistors N1, N2, P1, and P2 are commonly connected to a signal input terminal IN, and the junction point of the drain of the p-channel MOS transistorP2 and the drain of the n-channel MOS transistor N2 is connected to a signal output terminal OUT.

The delay circuit thus configured operates as an inverter. It is known that the signal delay value of such delay circuit provides a larger delay value than that provided by the delay circuit of the CMOS inverter composed of one p-channel MOS transistor and one n-channel MOS transistor.

FIG. 1B shows another delay circuit configured by connecting three p-channel MOS transistors P1, P2 and P3, and three n-channel MOS transistors N1, N2 and N3 in series between the power supply and the ground.

In this case, the delay value changes as the number of the MOS transistors connected in series is increased as shown in FIG. 2. In FIG. 2, the axis of abscissa indicates the numbers of each group of p-channel MOS transistors and n-channel MOS transistors connected in series, while the axis of ordinate indicates resulting delay value td.

In case of such a type of delay circuit, however, it is known that the delay changes greatly with the number of stages connected in series when an attempt is made to adjust the delay by changing the number of transistors to be connected in series in order to set a desired delay value, thus making it difficult to accomplish fine adjustment of delay value.

For instance, if the number of stages of the p-channel and n-channel MOS transistors to be connected in series is changed from two each as shown in FIG. 1A to three each as shown in FIG. 1B, the delay value will be almost doubled as shown in FIG. 2. This increase in delay corresponds to a change of approximately a several 100 nS in a typical CMOS circuit.

Therefore, in case it is desired to delicately control the delay so as to generate a delay with an accuracy level of, for example, about a several 10 nS, it is necessary to provide other means for adjusting the load capacity other than the delay circuit.

In general, the required configuration calls for wiring, additional gates, etc., resulting in a problem in that an additional space for installing the additional components is required, which means an increase of the space of a chip.

SUMMARY OF THE INVENTION

The present invention has been made with a view to solving the problem described above. It is an object of the present invention to provide a semiconductor device which enables precise control of a delay value without the need for considerably changing a circuit configuration, e.g. changing load wiring or adding a circuit.

To this end, according to the present invention, there is provided a delay circuit comprised of a plurality of p-channel transistors and n-channel transistors connected in series, wherein the p-channel transistors and the n-channel transistors are provided with capabilities that differ, ranging from the transistors closer to a power supply to the transistors closer to an output end.

BRIEF DESCRIPTION OF THE DRAWINGS

FIG. 1A and FIG. 1B show the circuit configurations of conventional delay circuits;

DETAILED DESCRIPTION OF THE PREFERRED EMBODIMENTS

The invention will now be described. A preferred embodiment of the delay circuit in accordance with the invention is provided with a plurality of p-channel MOS transistors and a plurality of n-channel MOS transistors connected in series between a high-potential power supply VDD and a low-potential power supply GND. The gate terminals of the plurality of p-channel MOS transistors and n-channel MOS transistors are commonly connected to a signal input terminal IN. The junction point of the p-channel MOS transistor farthest from the high-potential power supply VDD and the n-channel MOS transistor farthest from the low-potential power supply GND provides an output terminal OUT. The current drive capabilities of the plurality of the p-channel MOS transistors and the current drive capabilities of the plurality of the n-channel MOS transistors are made different, ranging from the transistors closest to the power supply VDD and GND to the transistors closest to the output terminal OUT.

In the embodiment of the invention, if the plurality of p-channel MOS transistors are numbered (denoted by a subscript "i") in sequence, beginning with the transistor closest to the high-potential power supply, and the gate width thereof is denoted by Wpi; and the plurality of n-channel MOS transistors are numbered (denoted by a subscript "i") in sequence, beginning with the transistor closest to the low-potential power supply, and the gate width thereof is denoted by Wni; then the preferable gate width relationship is as shown below:

$$Wpi < Wp(i+1), Wni < Wn(i+1)$$

The embodiment of the present invention will be described with reference to the accompanying drawings.

Figure 2:
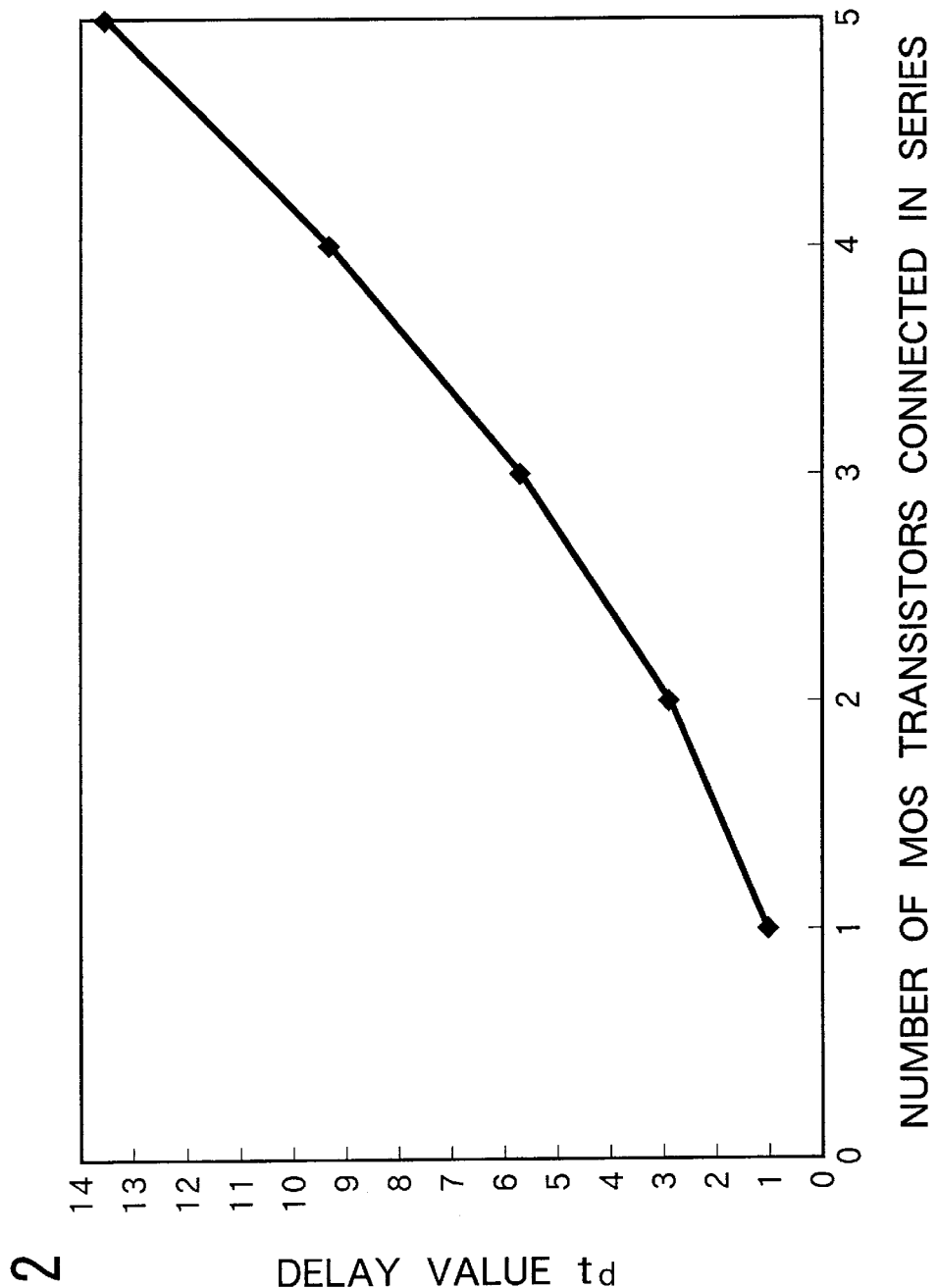
FIG. 2 is a characteristic chart illustrative of delay values in relation to the number of transistors connected in series in the delay circuits shown in FIG. 1.
Figure 3:
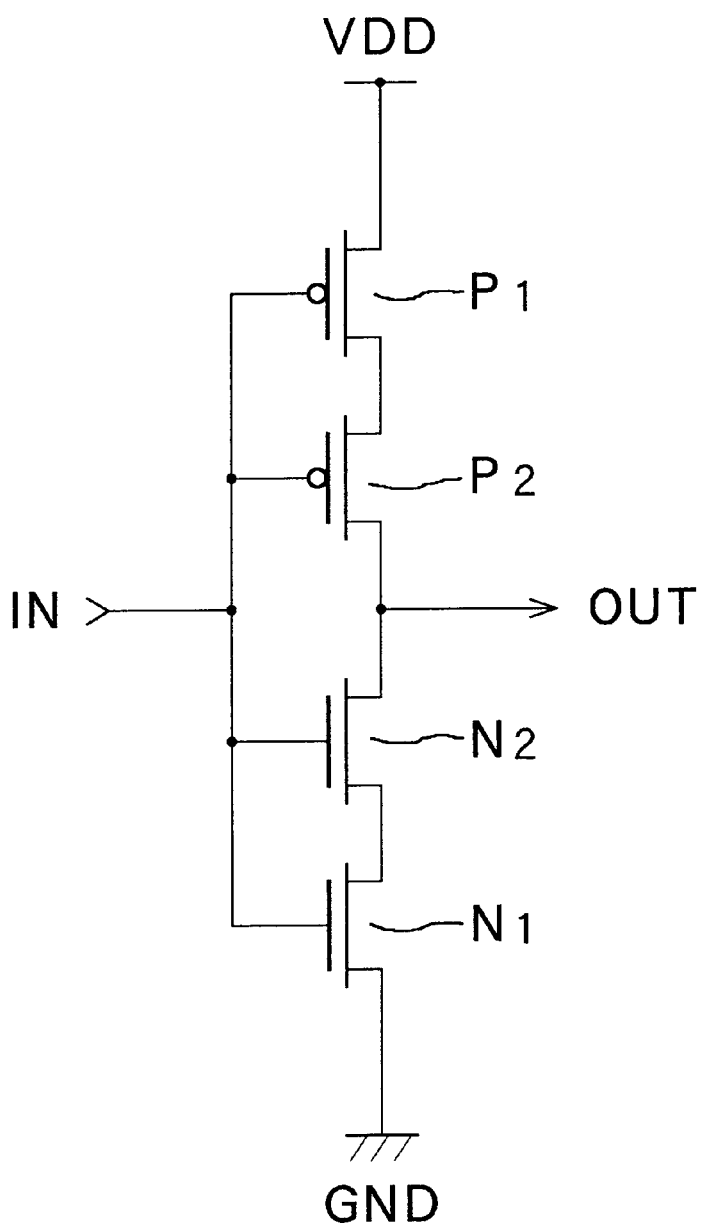
FIG. 3 shows a circuit configuration of the delay circuit representing an embodiment of the present invention.

FIG. 3 shows the circuit configuration of the delay circuit according to a first embodiment of the invention. Referring to FIG. 3, two p-channel MOS transistors P1 and P2, and two n-channel MOS transistors N2 and N1 are connected in series in the order in which they are listed between the power supply VDD and the ground GND in this embodiment. More specifically, the source of the p-channel MOS transistor P1 is connected to the power supply VDD and the drain thereof is connected to the source of the p-channel MOS transistor P2. The drain of the p-channel MOS transistor P2 is connected to the drain of the n-channel MOS transistor N2; the source of the n-channel MOS transistor N2 is connected to the drain of the n-channel MOS transistor N1; and the source of the n-channel MOS transistor N1 is connected to the ground GND. The gate terminals of the transistors N1, N2, P1, and P2 are commonly connected to the signal input terminal IN, and the junction point of the drain of the p-channel MOS transistor P2 and the drain of the n-channel MOS transistor N2 is connected to the signal output terminal OUT.

There are the following relationships established among the channel widths, namely, Wn1, Wn2, Wp1, and Wp2, of the transistors N1, N2, P1, and P2:

$$Wn1 < Wn2 \quad (1\text{-}a)$$

$$Wp1 < Wp2 \quad (1\text{-}b)$$

The delay circuit thus configured acts as an inverter. The following description will be given on the assumption that the ratio X of the channel widths of the transistors is equal on both the p-channel MOS transistors P1 and P2 and the n-channel MOS transistors N1 and N2.

$$X = Wn2/Wn1 = Wp2/Wp1 \quad (2)$$

Figure 4:
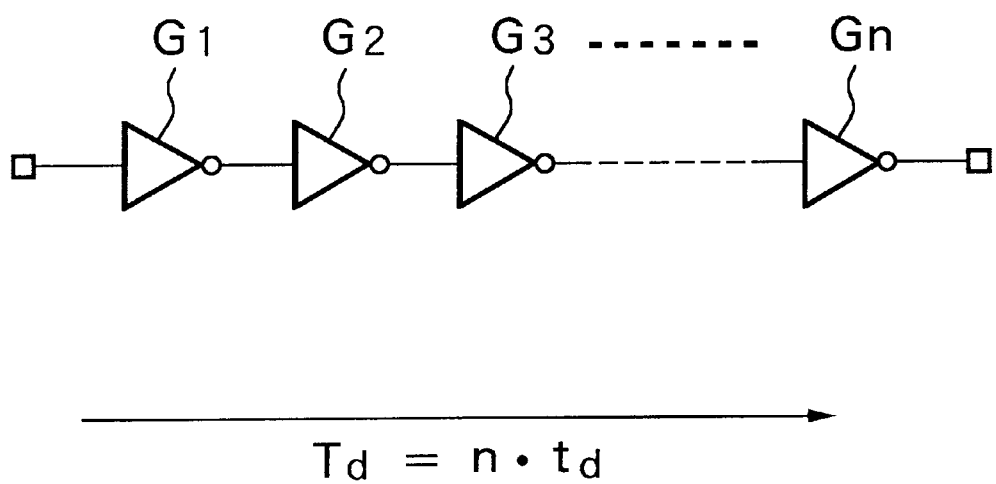
FIG. 4 shows a circuit configuration of an embodiment of the present invention in which multiple stages of the delay circuit shown in FIG. 1 are connected.

FIG. 4 shows an inverter train of a plurality of stages (n:number of stages) of the delay circuit shown in FIG. 3; each of delay circuits G1, G2, . . . , and Gn is the delay circuit shown in FIG. 3. The delay value Td in this case is the multiple of n of delay value td of each circuit shown in FIG. 3.

Figure 5:
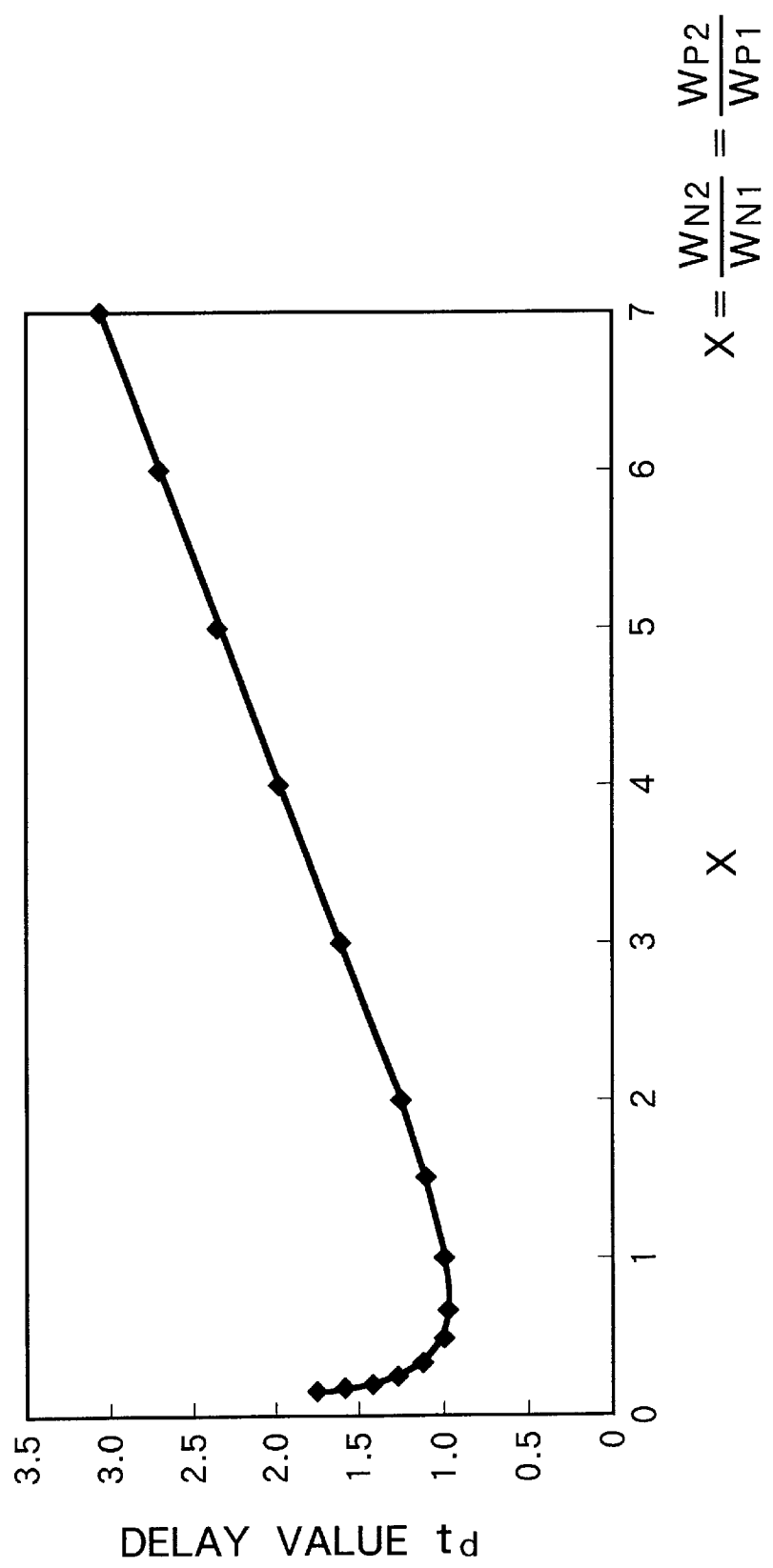
FIG. 5 is a characteristic chart illustrative of the changes in the delay in relation to the ratio of the channel width of the transistors connected in series in the delay circuit of FIG. 3.

FIG. 5 shows the characteristics of the delay value td (the axis of ordinate) for one stage of the delay circuit in accordance with the embodiment (see FIG. 3) in relation to the ratio X (the axis of abscissa) of the channel width W of the transistors.

The operation of the delay circuit of the embodiment will now be described.

In the case of a CMOS circuit, the circuit delay is determined mainly by load capacity C and the output impedance Z of the gate driving it; and delay time Tp is proportional to C/Z.

In the circuit shown in FIG. 4, the load capacity is nearly equal to the gate capacity of the transistor of the gate input of the following stage and hence, it is proportional to the channel width W of the transistor; and the output impedance Z of the load drive gate is decided by the ON resistance of the transistor, so that it is proportional to the gate channel width W of the transistor. Thus, the delay value of the circuit is decided by the ratio X of the transistor channel widths W of the transistors. This relationship is illustrated in FIG. 5.

As it can be seen from FIG. 5, the circuit delay with respect to the ratio X of the transistor channel widths W is represented by a curve projecting downward wherein the ratio takes a minimum value in the vicinity of 1. Especially in the zone where the ratio X of the transistor channel widths is larger than 1, the circuit delay monotonously increases in succession; it increases from about 100% to about 200% in the zone where the ratio X is in the range of 1 to 3.

Figure 6:
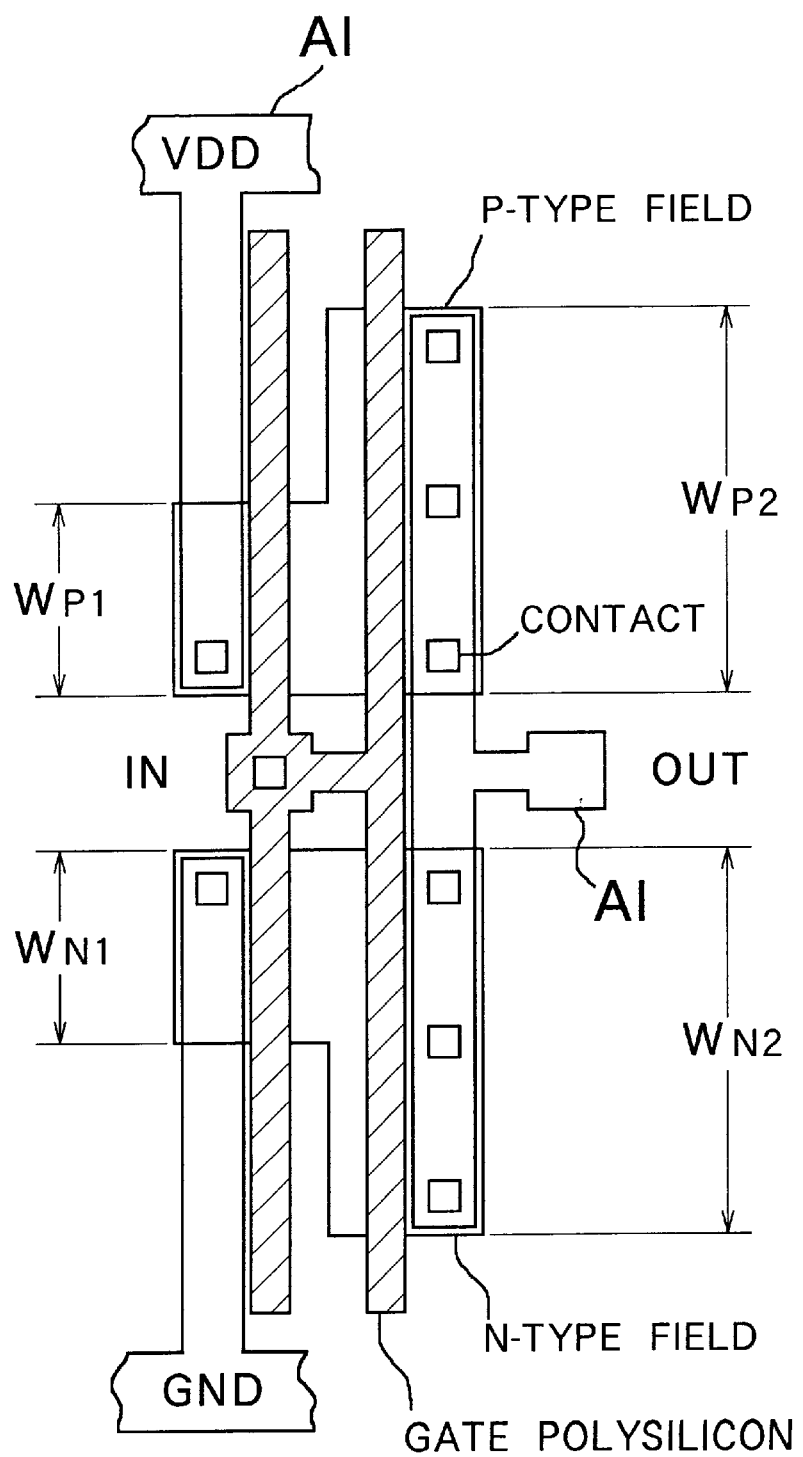
FIG. 6 is a top plan view showing an example of the layout of the semiconductor substrate of the delay circuit shown in FIG. 1.

FIG. 6 is a top plan view showing the layout of the delay circuit to be formed on a semiconductor substrate. For the purpose of easy understanding of the description, FIG. 6 shows only the fields, gate polysilicon member, Aluminium wiring, and contacts. In this layout, two n-channel MOS transistors and two p-channel MOS transistors which are composed of p-type fields with L-shaped planes and n-type fields, and H-shaped gate polysilicon members and which have different channel widths W are connected in series. The channel widths W of the MOS transistors connected in series are Wn1, Wn2, Wp1, and Wp2.

To adjust the delay time, only the shapes of the fields are changed to adjust the channel widths Wn1 and Wp1 of the MOS transistors closer to the power supply (VDD) while maintaining the channel widths Wn2 and Wp2 of the MOS transistors closer to the output (OUT) constant.

This embodiment is advantageous in that the delay time can be adjusted merely by changing the field masks in the manufacturing process of semiconductors.

It is also advantageous that the influences on the signal waveforms in the preceding stage in the circuit can be minimized since the smaller channel widths W of the MOS transistors are changed and hence the input capacity of the delay circuit scarcely changes.

Thus, according to the present invention, in a delay circuit composed of a plurality of MOS transistors connected in series, the delay can be adjusted with high accuracy by providing the transistors with channel widths that differ, ranging from the transistors closer to the power supply to the transistors closer to the output end.

What is claimed is:

1. A delay circuit on a semiconductor device, the delay circuit comprising:
   a plurality of p-channel transistors and a plurality of n-channel transistors connected in series from a high-potential power supply to a low-potential power supply;
   an input signal being commonly supplied to the gate terminals of said plurality of p-channel transistors and n-channel transistors; and
   the junction point of the p-channel transistor farthest from said high-potential power supply and the n-channel transistor farthest from said low-potential power supply providing an output terminal;

wherein the current drive capabilities of said plurality of p-channel transistors and the current drive capabilities of said plurality of n-channel transistors are different, ranging from the transistors closer to said power supplies to the transistors closer to said output terminal; and wherein a ratio of said current drive capabilities of said p-channel transistors closer to said power supplies to said p-channel transistors closer to said output terminal is equal to a ratio of said current drive capabilities of said n-channel transistors closer to said power supplies to said n-channel transistors closer to said output terminal.

2. A delay circuit according to claim 1, wherein: if said plurality of p-channel MOS transistors are numbered using a subscript "i" in sequence, beginning with the transistor located most closely to said high-potential power supply, and the gate width thereof is denoted by Wpi; said plurality of n-channel MOS transistors are numbered using the subscript "i" in sequence, beginning with the transistor located most closely to said low-potential power supply, and the gate width thereof is denoted by Wni; then a gate width relationship shown below applies:

$$W_{pi} < W_{p(i+1)}, \ W_{ni} < W_{n(i+1)}.$$

3. A delay circuit according to claim 1, wherein said p-channel and n-channel transistors are MOS transistors.

4. A delay circuit according to claim 1, wherein said current drive capabilities are adjusted by changing field masks in the manufacturing process of said delay circuit transistors.

5. A delay circuit according to claim 4, wherein only the current drive capabilities of said p-channel and n-channel transistors closer to said power supplies are adjusted.

6. A delay circuit according to claim 1, wherein the ratio of said current drive capabilities of said p-channel and n-channel transistors closer to said power supplies to respective p-channel and n-channel transistors closer to said output terminal ranges from 1 to 3.

* * * * *